United States Patent [19]

Mills

[11] Patent Number: 5,525,931

[45] Date of Patent: Jun. 11, 1996

[54] HIGH-SPEED VIDEO AMPLIFIER

[75] Inventor: Thomas B. Mills, Sunnyvale, Calif.

[73] Assignee: National Semiconductor Corporation, Santa Clara, Calif.

[21] Appl. No.: 428,755

[22] Filed: Apr. 25, 1995

[51] Int. Cl.$^6$ ............................................. H03F 3/45
[52] U.S. Cl. .................. 330/255; 330/260; 330/263; 330/294; 330/298
[58] Field of Search .............................. 330/207 P, 255, 330/260, 263, 294, 298

[56] References Cited

U.S. PATENT DOCUMENTS

| | | | |
|---|---|---|---|
| 3,839,648 | 10/1974 | Pace | 330/260 X |
| 4,494,164 | 1/1985 | Noel | 330/298 X |
| 4,827,223 | 5/1989 | Gross | 330/263 X |
| 4,860,107 | 8/1989 | Furrey | 358/184 |

FOREIGN PATENT DOCUMENTS

01199374  10/1986  European Pat. Off. .

Primary Examiner—James B. Mullins
Attorney, Agent, or Firm—Skjerven, Morrill, MacPherson, Franklin & Friel

[57] ABSTRACT

In a video amplifier including a voltage gain stage and a current-amplifying output stage, feedback is applied from an output to an input of the voltage gain stage. The output stage includes a first current gain stage having a first push-pull amplifier and a second push-pull amplifier. The inputs of each of these push-pull amplifiers is connected to an output of the voltage gain stage. The output stage also includes a second current gain stage having a common-collector NPN transistor and a common-collector PNP transistor, the NPN transistor having its base terminal connected to the output of the first push-pull amplifier of the first current gain stage, and the PNP transistor having its base terminal connected to the output of the second push-pull amplifier of the first current gain stage. The output of the output stage is provided at an output terminal connected to the emitters of the NPN and PNP transistors of the second current gain stage.

13 Claims, 5 Drawing Sheets

HIGH-SPEED VIDEO AMPLIFIER

BACKGROUND OF THE INVENTION

1. Field of the Invention

This invention relates to amplifiers, and more specifically, to a video amplifier.

2. Description of the Prior Art

In a video display driver, a video output amplifier provides a high-level video output signal to an image display device such as a cathode ray tube (CRT). The video output signal is conveyed to a signal input electrode of the CRT, e.g., a cathode electrode. Unfortunately, the CRT-signal input electrode can exhibit a capacitance large enough to impair the high-frequency response of the video signal developed at the output of the driver amplifier. Thus, it is desirable to reduce the effect of the CRT capacitance upon the driver-amplifier output signal, thereby preventing degraded high-frequency response and its associated degradation of image resolution.

Figure 1:
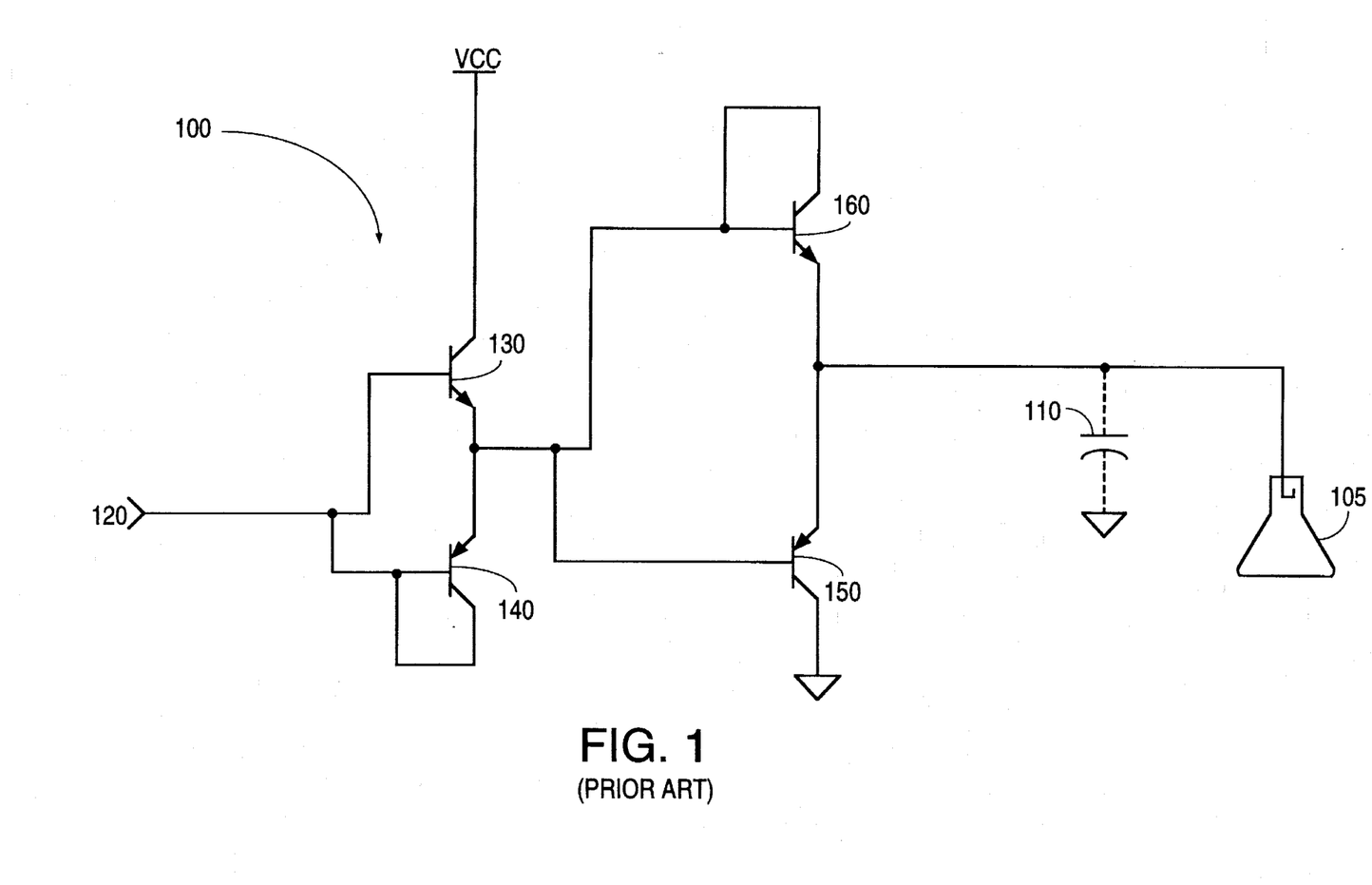
FIG. 1 shows a prior art video output circuit coupled to a signal input electrode of a CRT.

FIG. 1 shows a prior art video output circuit 100 coupled to a signal input electrode of a CRT 105. Video output circuit 100 is used to reduce the effect of the capacitance of CRT 105 (represented by capacitor 110) upon driver-amplifier output signals. A typical value for capacitor 110 is 15 pF.

An input node 120 receives a video signal from a video input stage (not shown). The first buffer stage includes an NPN emitter-follower transistor 130 and a diode-connected PNP transistor 140, and the second buffer stage includes a PNP emitter-follower transistor 150 and a diode-connected NPN transistor 160. The voltage supplies are the positive supply voltage VCC and ground.

NPN emitter-follower transistor 130 and diode-coupled PNP transistor 160 are arranged in cascade in the output signal path from input node 120 to capacitance 110. Similarly, PNP emitter-follower transistor 140 and diode-coupled NPN transistor 160 are arranged in cascade in the output signal path from input node 120 to capacitance 110. Diode-coupled transistors 140 and 160 are connected across the base-emitter junctions of transistors 130 and 150, respectively. In addition, diode-coupled transistors 140 and 160 and are biased for forward current conduction in a direction opposite to the forward current conduction of the associated base-emitter junctions of transistors 130 and 150, respectively.

A rapid positive-amplitude transition on input node 120 is propagated to CRT 105 via conductive transistor 130 and conductive transistor 160. Transistors 140 and 150 are reversed biased (i.e. nonconductive) at this time. Conversely, rapid negative amplitude transitions on input node 120 are propagated to CRT 105 via conductive transistors 140 and 150. Transistors 130 and 160 are reversed biased at this time.

Output circuit 100 has a disadvantage in that for either positive or negative amplitude transitions, only one stage of current gain is provided because diode-connected transistors 140 and 160 provide no current gain. Moreover, because current gain is limited, output circuit 100 must be provided with a significant input current at input node 120 to drive the output capacitance, especially at relatively high frequencies. This need for a high input current translates into a need for an input stage with excessive power requirements.

For the foregoing reasons, there is a need for a video amplifier that includes a high-bandwidth, low-power voltage gain stage coupled to a high-current-gain output stage.

SUMMARY

The present invention is directed to a high-bandwidth, low-power video amplifier circuit. In accordance with a first embodiment of the present invention, an amplifier output stage includes a first current gain stage having a first push-pull amplifier and a second push-pull amplifier. The inputs of each of these push-pull amplifiers is connected to an input node of the output stage.

The amplifier also includes a second current gain stage having an NPN transistor and a PNP transistor, the NPN transistor having its base terminal connected to the output of the first push-pull amplifier of the first current gain stage, and the PNP transistor having its base terminal connected to the output of the second push-pull amplifier of the first current gain stage. The output of the output stage is provided at an output terminal connected to the collectors of the NPN and PNP transistors of the second current gain stage.

In accordance with a second embodiment of the present invention, the output stage is provided an input from a voltage gain stage. The voltage gain stage includes a differential amplifier stage having first and second differential inputs and an output node coupled to the output stage. A feedback network is connected between an input and an output of the differential amplifier stage.

DETAILED DESCRIPTION

First Embodiment

Figure 2:
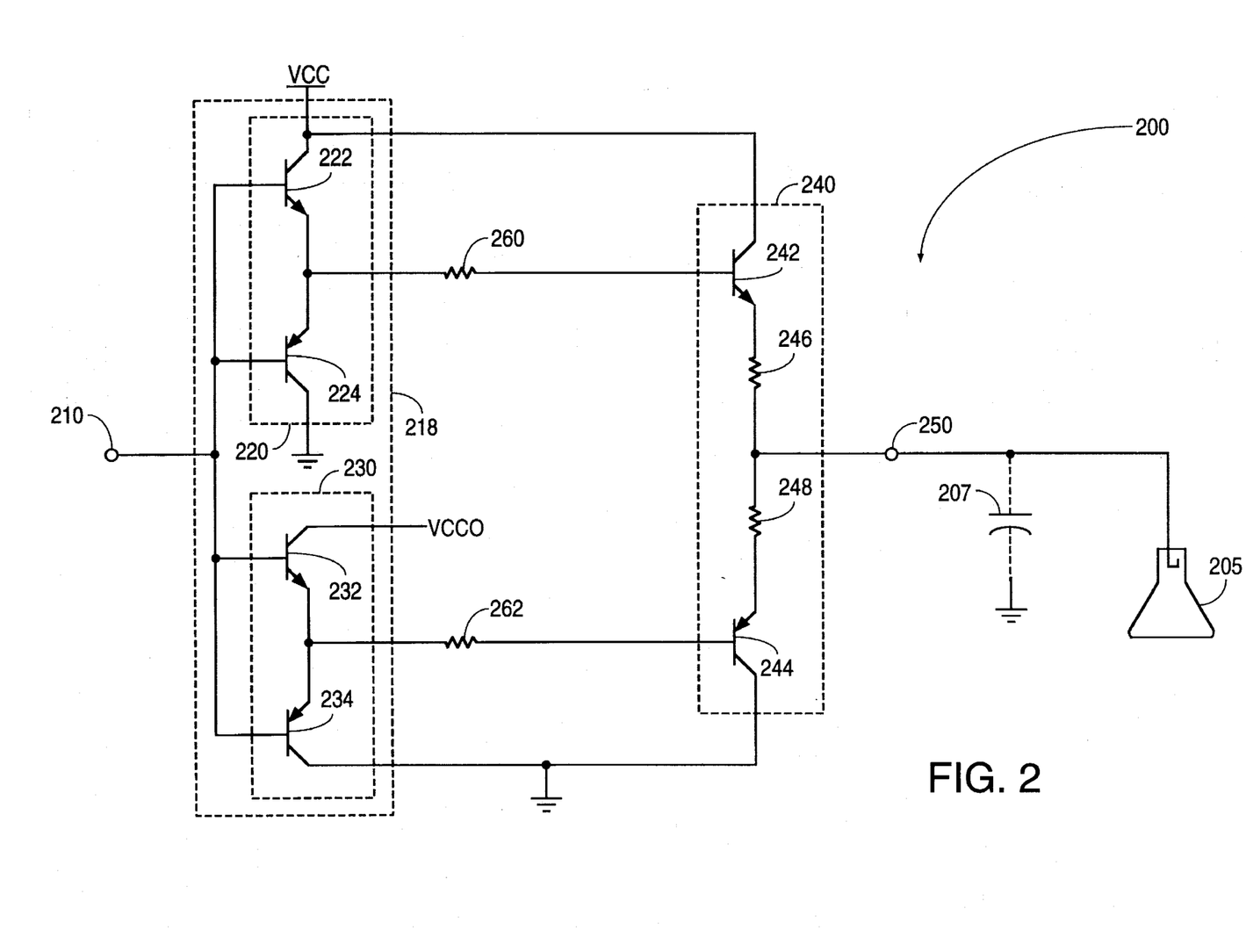
FIG. 2 shows a first video-amplifier output stage in accordance with the present invention.

FIG. 2 shows a schematic of a video-amplifier output stage in accordance with the present invention. Output stage 200 is intended to be a portion of a low-power, high-speed operational amplifier but is not so limited. In one embodiment, output stage 200 has a frequency response of over 80 MHz. To achieve this, the circuit employs transistors that have an $f_T$ of 1.5 GHz, where $f_T$ is the frequency at which the forward collector-emitter current gain of a transistor is unity.

Output stage 200 includes an input node 210, a first current gain stage 218, which in turn includes a first push-pull amplifier 220 and a second push-pull amplifier 230, and a second current gain stage 240. Output stage 200 is coupled to an input electrode of a CRT 205, and serves to reduce the effect of the capacitance of CRT 205 upon CRT driver-amplifier output signals. The capacitance of CRT 205 is represented by a capacitor 207, which has a typical capacitance of 15 pF. This capacitance requires an output current of approximately 130 mA for a 40 volt peak-to-peak signal with 4.5 nsec rise/fall time.

The first push-pull amplifier 220 includes an NPN transistor 222 and a PNP transistor 224, the second push-pull amplifier 230 includes an NPN transistor 232 and a PNP transistor 234, and the second current gain stage 240 includes an NPN transistor 242 and a PNP transistor 244.

The collectors of NPN transistors 222, 232, and 242 are coupled to a positive voltage supply VCCO. In one embodiment, VCCO is approximately 80 volts. The collectors of PNP transistors 224, 234, and 244 are coupled to ground. The emitters of transistors 222 and 224 are coupled to the base of transistor 242 via a resistor 260, and the emitters of transistors 232 and 234 are coupled to the base of transistor 244 via a resistor 262. Resistors 260 and 262 are typically 200 ohms each.

The emitters of transistors 242 and 244 are coupled to one another via two 4-ohm resistors, resistors 246 and 248. Input node 210 is coupled to the bases of transistors 222, 224, 232, and 234. Finally, output node 250 is coupled to the emitter of transistor 242 via resistor 246, the emitter of transistor 244 via resistor 248, and to CRT 205 (and, consequently, to the CRT capacitance represented by capacitor 207).

A positive voltage transition on input node 210 forward biases NPN transistors 222 and 232 and reverse biases PNP transistors 224 and 234. Assuming a typical forward-bias voltage drop across the base-emitter junctions of transistors 222 and 232, the voltages on the emitters of transistors 222 and 232 will be 0.7 volts below the voltage on input node 210.

Forward biasing transistor 232 provides a current path that allows for fast removal of charge at the base of transistor 244, and hence quickly shuts off transistor 244. Forward biasing transistor 222 causes a current-amplified version of the signal on input node 210 to be output from the emitter of transistor 222 and fed through resistor 260 to the base of output transistor 242, thereby forward biasing transistor 242. Again assuming a forward-biased base-emitter voltage of 0.7 volts, the voltage of the signal on the emitter of transistor 242 will be 0.7 volts below the voltage of the input signal at the base of transistor 242.

Transistor 242 provides a second stage of current gain by amplifying the current of the signal at the base of transistor 242. This second current-amplified version of the input signal is fed through resistor 264 to output terminal 250. Because emitter-follower amplifier configurations do not invert the phase of an input signal, the output signal on output terminal 250 will be in-phase with the input signal on input node 210.

A negative voltage transition on input node 210 reverse biases NPN transistors 222 and 232 and forward biases PNP transistors 224 and 234. Assuming a typical voltage drop across the base-emitter junctions of transistors 224 and 234, the voltages on the emitters of transistors 224 and 234 will be 0.7 volts above the voltage on input node 210.

Forward biasing transistor 224 provides a current path that allows for fast removal of charge at the base of transistor 242, and hence quickly shuts off transistor 242. Forward biasing transistor 234 causes a current-amplified version of the input signal on input node 210 to be output from the emitter of transistor 234 and fed through resistor 262 to the base of output transistor 244, thereby forward biasing transistor 244. Again assuming a forward biased base-emitter voltage of 0.7 volts, the voltage of the signal on the emitter of transistor 244 will be 0.7 volts above the voltage of the input signal at the base of transistor 244.

Transistor 244 provides a second stage of current gain by amplifying the current of the signal at the base of transistor 244 by the beta of transistor 244, typically 100. This second current-amplified version of the input signal is fed through resistor 266 to output terminal 250. Again, because emitter-follower amplifier configurations do not invert the phase of an input signal, the output signal on output terminal 250 will be in-phase with the input signal on input node 210.

The use of cascade-coupled emitter-followers (e.g., transistors 222 and 242) is advantageous because the increased current gain provided reduces the required input current required from the voltage gain stage, and thereby reduces the overall power requirements of the amplifier.

Second Embodiment

Figure 3:
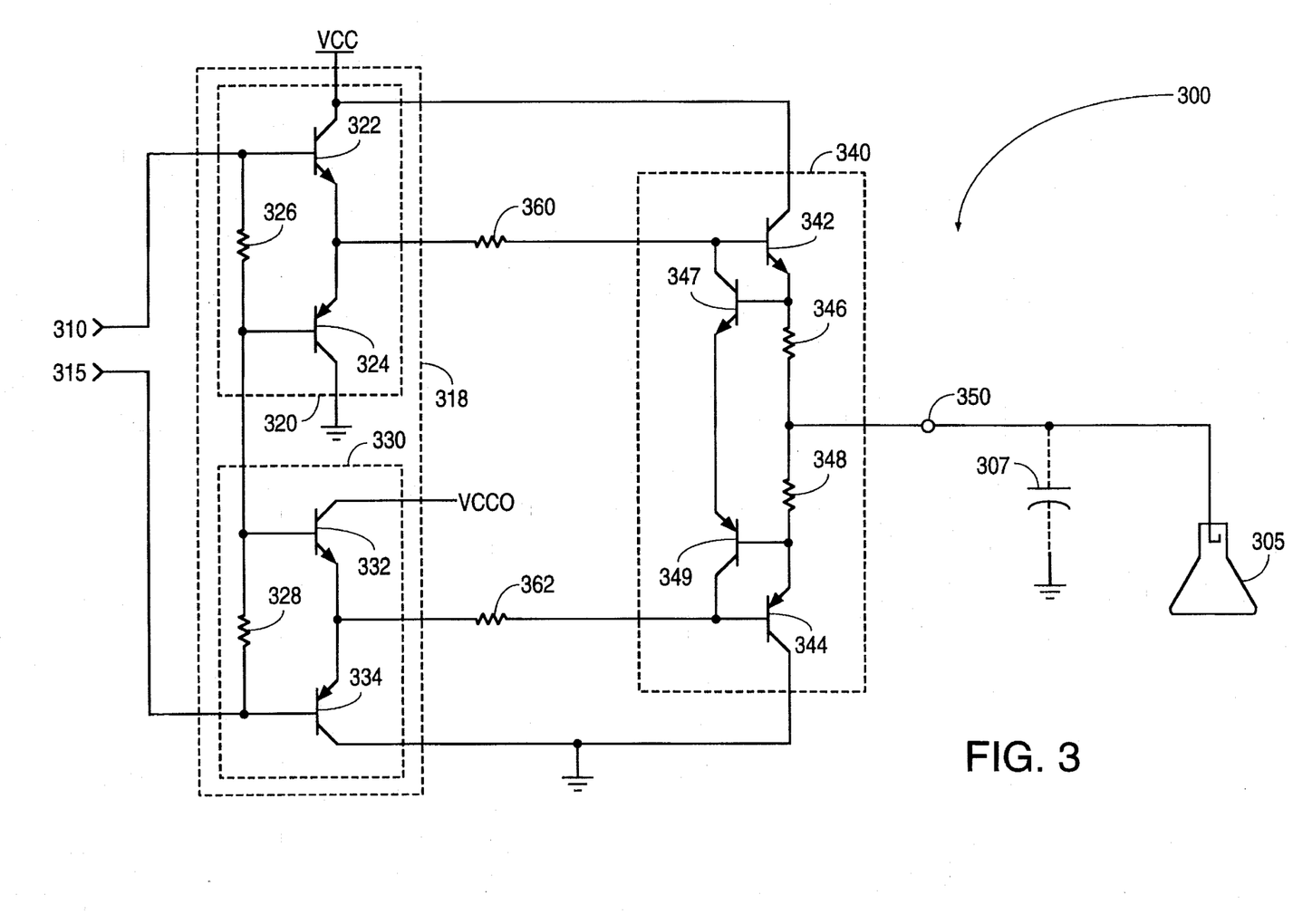
FIG. 3 shows a second video-amplifier output stage in accordance with the present invention.

FIG. 3 shows a schematic diagram of a second video-amplifier output stage 300 in accordance with the present invention. Output stage 300, much like output stage 200, includes a first input node 310 and a second input node 315, a first current gain stage 318, a second current gain stage 340, and an output node 350. Many of the elements in FIG. 3 are identical to those of output stage 200 of FIG. 2, identical elements being numbered such that the last two digits are the same in both figures.

Output stage 300 includes a resistor 326 coupled between the base of transistor 322 and the bases of transistors 324 and 332, and a resistor 328 coupled between the base of transistor 334 and the bases of transistors 324 and 332. Resistors 326 and 328, typically 100 ohms each, establish the DC bias voltage for transistors 324 and 332, and in so doing limit cross-over distortion in output circuit 300.

Output stage 300 also includes short-circuit protection transistors 347 and 349. The collector of transistor 347 is coupled to the base of transistor 342, the base of transistor 347 is coupled to the emitter of transistor 342, and the emitter of transistor 347 is coupled through an output terminal 350 to CRT 305. The collector of transistor 349 is coupled to the base of transistor 344, the base of transistor 349 is coupled to the emitter of 344, and the emitter of transistor 349 is coupled to output terminal 350. Output node 350 is coupled to the emitter of transistor 342 via resistor 364 and to the emitter of transistor 344 via resistor 366.

Transistors 347 and 349 conventionally provide short circuit protection for output node 350. If the current through resistor 346 exceeds a certain level, then transistor 347 turns on, diverting base current from transistor 342. Similarly, if the current through resistor 348 exceeds a certain level, then transistor 349 turns on, diverting base current from transistor 344. Transistors 347 and 349 do not conduct during normal circuit operation, and are therefore ignored in the following description of FIG. 3.

An analysis of appropriate nodes of this circuit provides an understanding of its operation, as described below.

Output circuit 300 is adapted to receive two input signals from a voltage gain stage such as those described below in connection with FIGS. 4 and 5. The signal on the first input node 310 varies in amplitude between approximately 32 volts and 72 volts. The signal on the second input node 315 is in phase with the signal on the first input node 313, and varies between approximately 30 volts and 70 volts. The amplitudes of these signals vary together such that the voltage difference between the first input node 310 and the second input node 315 is maintained at approximately 2 volts. The output voltage on output node 350 is approximately equal to the voltage on input node 315.

Resistors 326 and 328 have equivalent resistances, so that each drops approximately half of the 2-volt difference between the first input node 310 and the second input node 315, or 1 volt. In the steady state (i.e. when the voltage levels on input nodes 310 and 315 are not changing), the one-volt difference between the bases of transistors 322 and 324 is insufficient to turn on transistors 322 and 324 because each base-emitter junction requires approximately 0.7 volts (for a total of 1.4 volts) of forward bias to turn on. Similarly, the one-volt difference between the bases of transistors 332 and 334 is insufficient to turn them on. And, with the transistors of the first and second gains stages 320 and 330 off, no base current is supplied to transistors 342 and 344. Thus, these transistors are also off in the steady state.

Advantages of the present invention are realized when there are rapid changes in the voltage applied to the first and second input nodes 310 and 315, respectively. Assume, for example, that the voltage on the first input node 310 is 72 volts and the voltages on the second input node 315 and output node 350 are each 70 volts. Next, assume that the input voltages on the first and second input nodes 310 and 315 and are rapidly reduced to 32 and 30 volts, respectively.

The CRT capacitance represented by capacitor 307 will attempt to maintain the voltage on output node 350 at 70 volts. The voltage at the base of transistors 324 and 332 will immediately drop to the difference between 32 volts and 30 volts, or 31 volts. This voltage drop will forward bias transistor 324, providing a fast discharge path for charge stored at the base of transistor 342, thereby quickly shutting off transistor 342. Transistors 334 and 344 will be biased on, pulling down the voltage at the output node 44.

If, while transistors 334 and 344 are still conducting, the voltages on the first and second input nodes 310 and 315 are rapidly restored to the 72 and 70 volt level, respectively, the voltage at the base of transistor 332 will immediately rise to 71 volts. The 71 volt signal at the base of transistor 332 will forward bias transistor 332, and therefore provide a discharge path through transistor 332 for charge stored at the base of transistor 344. The rapid removal of charge stored at the base of transistor 344 will quickly turn off transistor 344 and allow now forward-biased transistors 322 and 342 to pull output node 350 up to the desired 70 volt output voltage.

Thus, in the present invention, transistors 324 and 332 advantageously increase the speed at which excess charge may be removed from the bases of transistors 342 and 344, respectively, thereby increasing the maximum operating frequency of the output stage 300. Moreover, the cascade-coupled emitter-follower configurations (e.g., transistors 322 and 342) provide increased current gain in output stage 300 and therefore reduce the input current required from the input stage.

Figure 4:
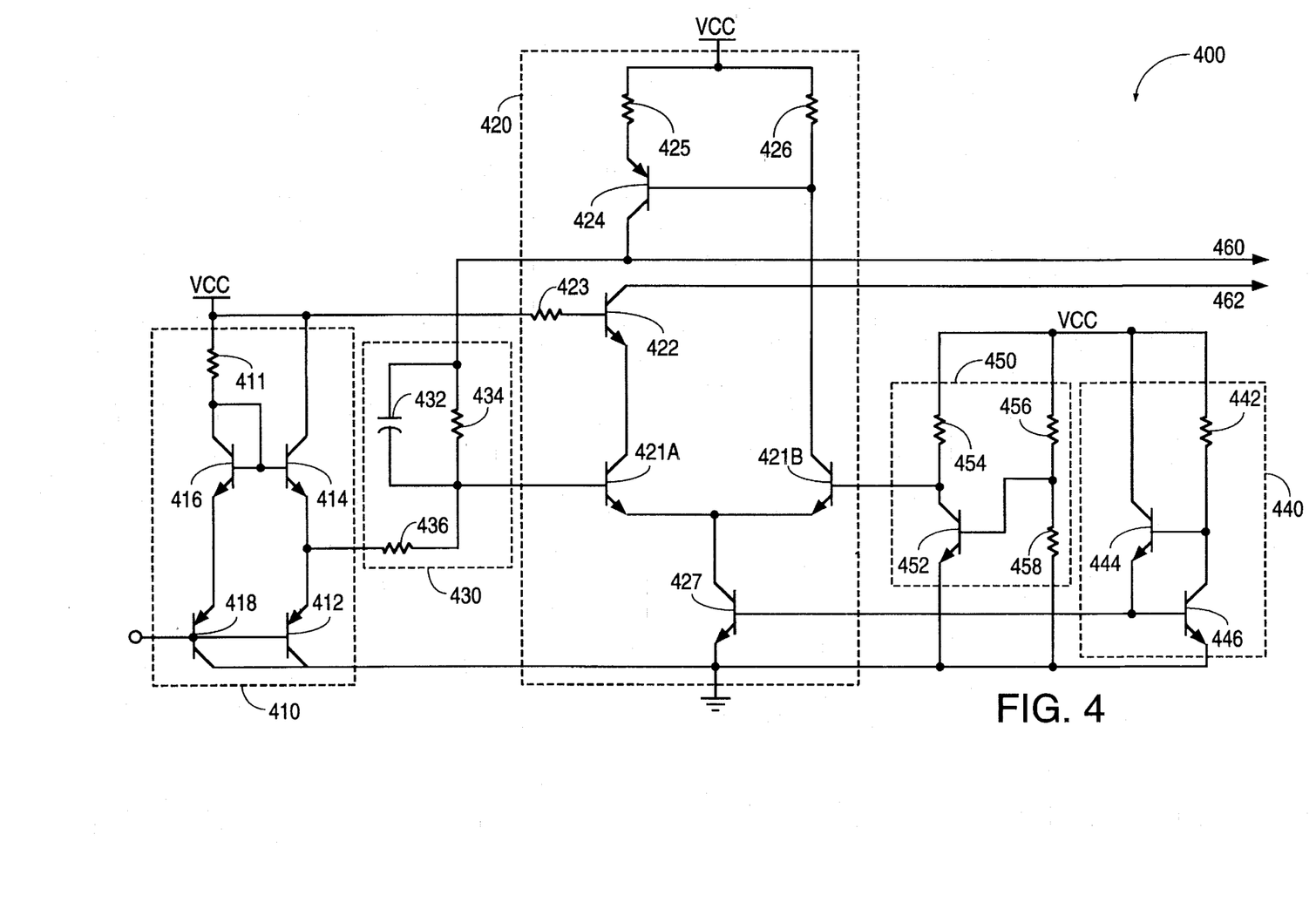
FIG. 4 shows a voltage gain stage that may be used in conjunction with the output stage of FIG. 3.

FIG. 4 shows an voltage gain stage 400 used in conjunction with the output stage of FIG. 3. Voltage gain stage 400 is not limited to use in video amplifiers, but may be used in other applications that require low-power, high-frequency voltage amplifiers. The voltage supplies are the positive supply voltage VCCO, positive supply voltage VCC, and ground. Typical voltages for VCCO and VCC are 80 volts and 12 volts, respectively. In one embodiment, voltage gain stage 400 and output stage 300 are combined, as a single integrated circuit.

Voltage gain stage 400 includes an input stage 410, a differential amplifier stage 420, a feedback network 430 coupled between differential amplifier stage 420 and input stage 410, a reference voltage source 450 for differential amplifier stage 420, and a current biasing network 440.

Input stage 410 is a conventional emitter-follower buffer that serves to increase the input impedance of voltage gain stage 400, and includes a resistor 411 and transistors 412, 414, 416, and 418. Resistor 411 typically has a resistance of 10 KΩ. If the high impedance achieved by using input stage 410 is not necessary for a particular application, input stage 410 may be omitted.

Differential amplifier stage 420 includes a current source transistor 427 that has its collector coupled to a differential pair of transistors, transistors 421A and 421B. Differential amplifier stage 420 also includes a transistor 424, the base of which is coupled to the collector of differential transistor 421B. Transistor 424 is biased by resistors 425 and 426. One output of voltage gain stage 400 is provided from the collector of transistor 424 to a first output node 460.

A cascode-coupled transistor 422 has its base connected to VCC through a biasing resistor 423, and is cascode connected between the collector of transistor 421A and a second output node 462. Cascode-coupled transistor 422 provides isolation to decrease Miller feedback capacitance, thereby increasing the bandwidth of voltage gain stage 400, and maintains a constant voltage on the emitter of transistor 421A. Maintaining a constant voltage on the emitter of transistor 421A is important because voltage changes on the collector of transistor 421A would result in heating and cooling of transistor 421A, which would, in turn, cause the forward bias voltage $V_{BE}$ of transistor 421A to change, resulting in an overshooting of the voltage waveform output by the voltage gain stage 400. Such overshooting causes a type of distortion called "thermal smearing" in a displayed image.

Feedback network 430 includes a compensation capacitor 432, a feedback resistor 434, and a feedback resistor 436. The collector of transistor 424, and therefore the first output node 460, is coupled to the inverting input of differential amplifier stage 420 through feedback resistor 434 and compensation capacitor 432. The output of input stage 410 is coupled to the inverting input of differential amplifier stage 420 via feedback resistor 436.

Conventional operational amplifiers provide feedback from the output stage back to the input stage. Importantly, feedback network 430 provides feedback around the voltage gain stage (i.e., differential amplifier stage 420) only, and not the entire video amplifier, which includes output stage 300. Feedback around the entire amplifier (e.g., voltage gain stage 400 and output stage 300) requires more compensation due to phase delay in the emitter followers of output stage 300, resulting in a 30 to 40% decrease in bandwidth for the entire video amplifier.

Compensation capacitor 432 compensates for phase shift across the voltage gain stage 400 that would, without compensation, cause the system to oscillate. The value of compensation capacitor 432 is selected to optimize the performance of operational amplifier stage 420: if the capacitance of compensation capacitor 432 is too large, the bandwidth of operational amplifier stage 420 will be unnecessarily small, and if the capacitance is too small, operational amplifier stage 420 will "ring" and overshoot desired output voltages.

Biasing network 440, combined with current source transistor 427, make up a conventional current source with current gain. The value of resistor 442 is selected so that transistor 446 is biased in the forward-active region, in which a transistor's base-emitter voltage is directly related to its collector current. Because transistors 446 and 427 are connected such that they have the same base-emitter voltage, the currents through the collectors of transistors 446 and 427 will be approximately equal, with some error due to the finite current gain of transistors 446 and 427. Transistor 444 is provided to reduce this source of error. In one embodiment, the value of a resistor 442 is selected to provide a bias current through transistor 427 of approximately 25 mA.

Biasing network 450 establishes the appropriate bias for the non-inverting input of differential amplifier stage 420 (i.e., the base of transistor 421B). Biasing network 450 includes a PNP transistor 452 and resistors 454, 456, and 458. Resistor 454 is coupled between VCC and the emitter of transistor 452; resistor 456 is coupled between VCC and the base of transistor 452; and resistor 458 is coupled between ground and the base of transistor 452.

In one embodiment, VCC is 12 volts, resistor 454 is 4 KΩ, resistor 456 is 3.6 KΩ, and resistor 458 is 5.55 KΩ. Applying Ohm's law, the bias voltage at the base of transistor 452 is therefore 12 V(5.55 KΩ/(3.6 KΩ+5.55 KΩ)), or 7.3 volts. Adding this to the forward-biased base-emitter voltage of transistor 452, the bias voltage at the base of transistor 421B (i.e., the non-inverting input of differential amplifier stage 420) is approximately 8 volts.

The input signal on input terminal 410 typically varies from approximately 1.9 to 4.6 volts, for a peak-to-peak voltage of approximately 2.7 volts. Because of the 0.7 volt forward bias of the emitter-base junction of transistor 412, the output of input stage 410 varies from approximately 2.6 to 5.3 volts.

The voltage gain of voltage gain stage 400 is determined by the ratio of the values of feedback resistors 434 and 436. In the circuit of FIG. 4, resistor 434 is a 15 KΩ resistor and transistor 6 is a 1 KΩ resistor. Thus, the ratio of the resistors, and therefore the voltage gain $A_V$ of voltage gain stage 400, is approximately 15 KΩ divided by 1 KΩ, or 15. Thus, the 2.7 volt peak-to-peak signal at the output of input stage 410 is amplified fifteen times to provide an output signal of approximately 40 volts peak-to-peak.

Differential amplifier stage 420 is biased such that the output signal on the first output terminal 460 varies from approximately 32 volts to 72 volts, and the output signal on the second output terminal 462 varies from approximately 30 volts to 70 volts. (Note that these bias voltages are established in part by resistors 326 and 328 of FIG. 3.) These signals vary together such that the voltage difference between the first and second output terminals 460 and 462, respectively, remains at approximately 2 volts. These signals are provided to the first and second input terminals 310 and 315, respectively, of FIG. 3.

Figure 5:
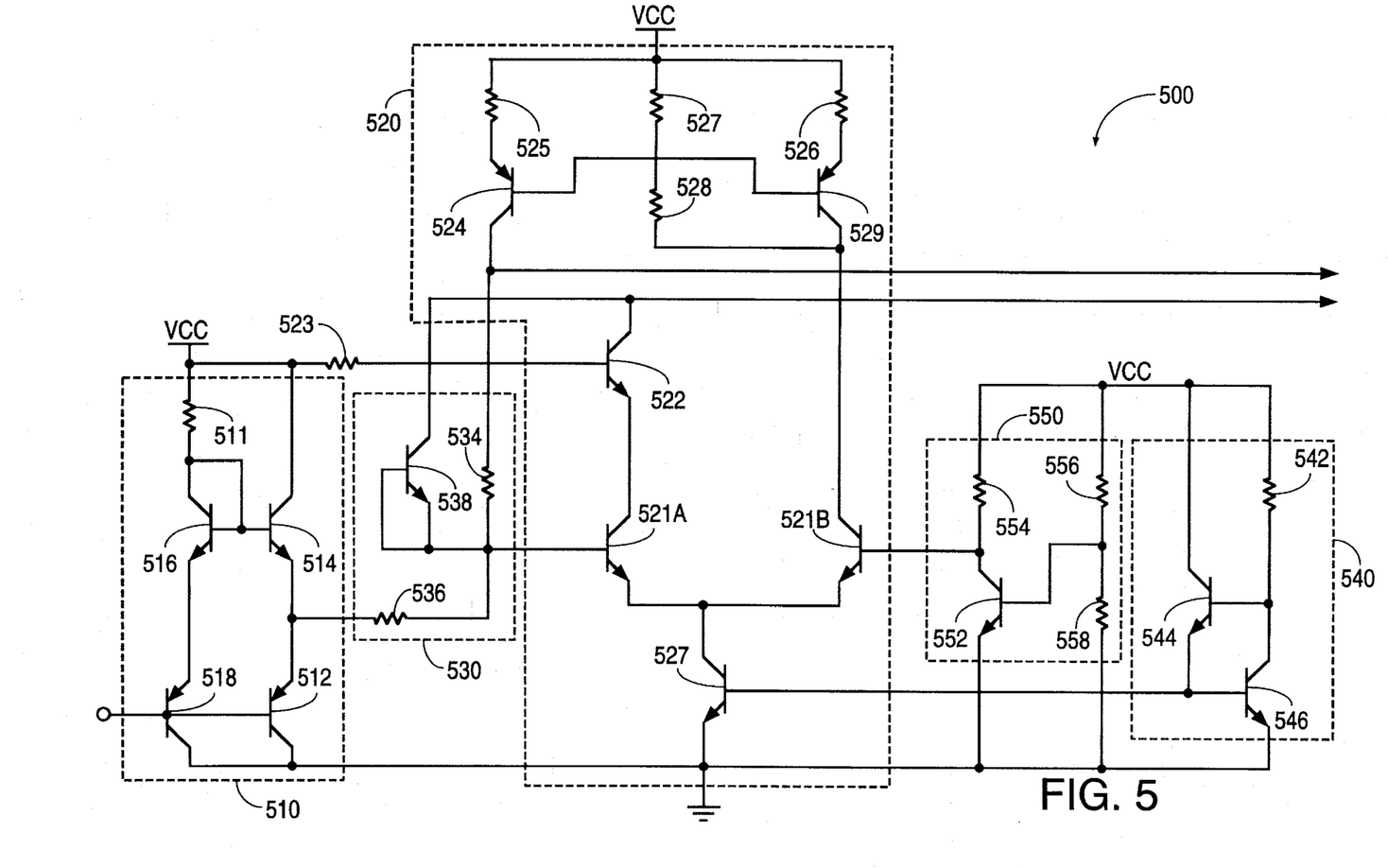
FIG. 5 shows a second voltage gain stage that may be used in conjunction with the output stage of FIG. 3.

FIG. 5 shows a second voltage gain stage 500 in accordance with the present invention. Voltage gain stage 500, much like voltage gain stage 400, includes an input stage 510, a differential amplifier stage 520, a feedback network 530 coupled between differential amplifier stage 520 and input stage 510, a reference voltage source 550 for differential amplifier stage 520, and a current biasing network 540. Many of the elements in FIG. 5 are identical to those of voltage gain stage 400 of FIG. 4, identical elements being numbered such that the last two digits are the same in both figures. The differences that do exist are between feedback networks 430 and 530, respectively, and between differential amplifiers 420 and 520, respectively.

Feedback network 530 includes a diode-coupled transistor 538 coupled between the base of differential transistor 521A and the collector of cascode-coupled transistor 522. (Diode-coupled transistor 538 could also be connected between the base of differential transistor 521A and the collector of transistor 524.) The collector-base capacitance of diode-coupled transistor 538 compensates for phase shift across the operational amplifier stage 500 that would, without compensation, cause the system to oscillate. The capacitance of diode-coupled transistor 538 is selected to optimize the performance of operational amplifier stage 520: if the capacitance is too large, the bandwidth of operational amplifier stage 520 will be unnecessarily small, and if the capacitance is too small, operational amplifier stage 520 will "ring" and overshoot desired output voltages.

The use of diode-coupled transistor 538 in place of a capacitor is beneficial because the capacitance of diode-coupled transistor 538 is susceptible to many of the same variables as are associated other transistors used in the circuit. This is especially true where the transistors are formed as components in an integrated circuit. Thus, the capacitance provided by diode-coupled transistor 538 can more accurately provide compensation.

Differential amplifier stage 520 includes additional biasing resistors 527 and 528, and a load transistor 529. Biasing resistors 527 and 528, which establish the bias for load transistor 529 and keep load transistor 529 from saturating, have values of 560 and 1400 ohms, respectively. Load transistor 529 provides a load for differential transistor 521B that tracks more closely than a purely resistive load because, like diode-coupled transistor 538, load transistor 529 is susceptible to many of the same variables, such as temperature, supply voltage, parasitic leakage, and oxide quality, as are the other transistors. Load transistor 529 therefore provides an output signal that more accurately reflects the input signal.

Although the present invention has been described in considerable detail with reference to certain versions thereof, other versions are possible. For example, analogous FET or MOS devices could be substituted for bipolar transistors, and the circuits described above could be implemented using discrete components. Also, voltage gain and current gain stages in accordance with the present invention are not limited to use in video amplifiers, but may be used in other applications in which low-power, high-frequency amplification is desired. Therefore, the spirit and scope of the appended claims should not be limited to the description of the versions contained herein.

I claim:

1. An amplifier comprising:

an input node;

a differential amplifier stage having a first differential input node connected to said input node, a first differential amplifier output node, and a second differential amplifier output node;

a feedback network coupled between said differential input node and said first differential amplifier output node; and an output stage coupled to at least one of said first and second differential amplifier output nodes;

wherein said feedback network comprises a resistor coupled in parallel with a capacitor.

2. The amplifier of claim 1, further comprising an input stage having an input-stage output node coupled to said input node.

3. The amplifier of claim 1, wherein said differential amplifier stage further comprises a second differential input node connected to a reference voltage source.

4. The amplifier of claim 3, wherein said differential amplifier stage further comprises:

a first transistor having a control terminal connected to said first differential input node and a first current-handling terminal connected to a current source;

a second transistor having a control terminal connected to said second differential input node and a first current-handling terminal connected to said current source;

an output transistor having a control terminal coupled to a second current-handling terminal of said second transistor and a current-handling terminal connected to said first differential amplifier output node; and a cascode-coupled transistor having a first current-handling terminal connected to a second current-handling terminal of said first transistor and a second current-handling terminal connected to said second differential amplifier output node.

5. The amplifier of claim 1, wherein said output stage comprises:

an output stage input node;

a first current gain stage having a first push-pull amplifier having a first transistor of a first polarity type and a second transistor of a second polarity type, each of said first and second transistors having a control terminal connected to said output stage input node; and a second push-pull amplifier having a third transistor of said first polarity type and a fourth transistor of said second polarity type, each of said third and fourth transistors having a control terminal connected to said output stage input node;

a second current gain stage having a fifth transistor of said first polarity type and a sixth transistor of said second polarity type, said fifth transistor having a control terminal connected to a first current-handling terminal of said first transistor and to a first current-handling terminal of said second transistor, said sixth transistor having a control terminal connected to a first current-handling terminal of said third transistor and to a first current-handling terminal of said fourth transistor; and an output node connected to a first current-handling terminal of said fifth transistor and to a first current-handling terminal of said sixth transistor.

6. The amplifier of claim 5, wherein each of said first, second, third and fourth transistors has a second current-handling terminal, said second current-handling terminal of said first and third transistors being connected to a first voltage supply, said second current-handling terminal of said second and fourth transistors being connected to a second voltage supply.

7. The amplifier of claim 6, wherein each of said fifth and sixth transistors has a second current-handling terminal, said second current-handling terminal of said fifth transistor being connected to said first voltage supply and said second current-handling terminal of said sixth transistor being connected to said second voltage supply.

8. The amplifier of claim 7, further comprising:

a first resistor connected between said first current-handling terminal of said first transistor and said control terminal of said fifth transistor; and a second resistor connected between said first current-handling terminal of said fourth transistor and said control terminal of said sixth transistor.

9. The amplifier of claim 8, further comprising:

a third resistor connected between said first current-handling terminal of said fifth transistor and said output node; and a fourth resistor connected between said first current-handling terminal of said sixth transistor and said output node.

10. The amplifier of claim 5, further comprising:

a second output stage input node connected to each of said control terminals of said first, second, third, and fourth transistors;

a fifth resistor connected between said control terminal of said first transistor and said control terminal of said second transistor; and a sixth resistor connected between said control terminal of said third transistor and said control terminal of said fourth transistor.

11. The amplifier of claim 10, further comprising:

a seventh transistor of said first polarity type, said seventh transistor having a control terminal coupled to said first current-handling terminal of said fifth transistor, a first current-handling terminal coupled to said output terminal, and a second current-handling terminal coupled to said control terminal of said fifth transistor; and an eighth transistor of said second polarity type, said eighth transistor having a control terminal coupled to said first current-handling terminal of said sixth transistor, a first current-handling terminal coupled to said output terminal, and a second current-handling terminal coupled to said control terminal of said sixth transistor.

12. The amplifier of claim 11, wherein said amplifier is an integrated circuit.

13. The amplifier of claim 11, wherein the transistors are bipolar transistors.

* * * * *